US009862170B2

(12) United States Patent
Wei et al.

(10) Patent No.: US 9,862,170 B2
(45) Date of Patent: Jan. 9, 2018

(54) METHOD FOR TRANSFERRING CARBON NANOTUBE ARRAY AND METHOD FOR FORMING CARBON NANOTUBE STRUCTURE

(71) Applicants: Tsinghua University, Beijing (CN); HON HAI PRECISION INDUSTRY CO., LTD., New Taipei (TW)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 628 days.

(21) Appl. No.: 14/524,789

(22) Filed: Oct. 27, 2014

(65) Prior Publication Data

US 2015/0360454 A1 Dec. 17, 2015

(30) Foreign Application Priority Data

Jun. 16, 2014 (CN) .......................... 2014 1 0279889

(51) Int. Cl.
*B32B 37/00* (2006.01)
*B32B 38/00* (2006.01)
(Continued)

(52) U.S. Cl.
CPC ........ *B32B 37/025* (2013.01); *C01B 31/0253* (2013.01); *C23C 16/01* (2013.01); *C23C 16/26* (2013.01)

(58) Field of Classification Search
CPC ..... C23C 16/26; C23C 16/01; C01B 31/0253; B32B 37/025; B32B 2262/106; B32B 2307/202; B32B 2307/412
See application file for complete search history.

(56) References Cited

U.S. PATENT DOCUMENTS 8,048,256 B2  11/2011  Feng et al.
8,068,626 B2  11/2011  Jiang et al.
(Continued)

FOREIGN PATENT DOCUMENTS

CN    101239712    8/2008
CN    101506413    8/2009
(Continued)

OTHER PUBLICATIONS

"Superaligned Carbon Nanotube Arrays, Films, and Yarns: A Road to Applications", Kaili Jiang et al.. Advanced Materials, vol. 23, pp. 1154-1161.

(Continued)

*Primary Examiner* — Robert J Grun
(74) *Attorney, Agent, or Firm* — ScienBiziP, P.C.

(57) ABSTRACT

A method for transferring a carbon nanotube array is disclosed. The carbon nanotube array has an ability to have a carbon nanotube structure drawn therefrom. The carbon nanotube array is transferred from a growing substrate to a substitute substrate, meanwhile the carbon nanotube array is still having the ability to have a carbon nanotube structure drawn from the substitute substrate. The substitute substrate is placed on the top surface of the carbon nanotube array. An adhesive layer is sandwiched between the substitute substrate and the carbon nanotube array. The substitute substrate is separated from the growing substrate, thereby separating the bottom surface of the carbon nanotube array from the growing substrate. A method for making a carbon nanotube structure is also disclosed.

15 Claims, 6 Drawing Sheets

(51) Int. Cl.
*B32B 37/12* (2006.01)
*B32B 5/02* (2006.01)
*B32B 37/18* (2006.01)
*C01B 31/02* (2006.01)
*C23C 16/01* (2006.01)
*C23C 16/26* (2006.01)

(56) References Cited

U.S. PATENT DOCUMENTS

| | | | |
|---|---|---|---|
| 8,101,953 B2 | 1/2012 | Jiang et al. | |
| 8,247,036 B2 | 8/2012 | Jiang et al. | |
| 8,248,377 B2 | 8/2012 | Jiang et al. | |
| 8,269,932 B2 | 9/2012 | Fu et al. | |
| 2004/0051432 A1* | 3/2004 | Jiang | B82Y 10/00 313/311 |
| 2008/0248235 A1 | 10/2008 | Feng et al. | |
| 2010/0075024 A1* | 3/2010 | Ajayan | C08K 7/24 427/66 |
| 2010/0123267 A1 | 5/2010 | Jiang et al. | |
| 2010/0170891 A1 | 7/2010 | Feng et al. | |
| 2011/0039075 A1 | 2/2011 | Feng et al. | |
| 2011/0140309 A1 | 6/2011 | Liu et al. | |
| 2011/0171419 A1 | 7/2011 | Li et al. | |
| 2011/0233816 A1 | 9/2011 | Liu | |
| 2012/0321785 A1 | 12/2012 | Rogers et al. | |
| 2013/0026679 A1 | 1/2013 | Chen et al. | |
| 2013/0255565 A1 | 10/2013 | Wei et al. | |

FOREIGN PATENT DOCUMENTS

| | | |
|---|---|---|
| CN | 101870463 | 10/2010 |
| CN | 101993055 | 3/2011 |
| CN | 102598191 | 7/2012 |
| TW | 200741747 | 11/2007 |
| TW | 201020204 | 6/2010 |
| TW | 201125042 | 7/2011 |
| TW | 201125814 | 8/2011 |
| TW | 201125814 A | 8/2011 |
| TW | 201134755 | 10/2011 |
| TW | 201134755 A | 10/2011 |
| TW | 201241876 | 10/2012 |
| TW | 201339088 | 10/2013 |

OTHER PUBLICATIONS

"A stretchable carbon nanotube strain sensor for human-motion detection", Takeo Yamada et al.; nature nanotechnology; vol. 6; pp. 296-301.

"Dry-Transfer of Aligned Mul tiwalled Carbon Nanotubes for Flexible Transparent Thin Films", Journal of Nanomaterials; vol. 2012; pp. 1-8.

* cited by examiner

METHOD FOR TRANSFERRING CARBON NANOTUBE ARRAY AND METHOD FOR FORMING CARBON NANOTUBE STRUCTURE

CROSS-REFERENCE TO RELATED APPLICATIONS

This application claims all benefits accruing under 35 U.S.C. §119 from China Patent Application No. 201410279889.1, filed on Jun. 16, 2014 in the China Intellectual Property Office, the contents of which are hereby incorporated by reference.

FIELD

The subject matter herein generally relates to methods for transferring carbon nanotube arrays and methods for forming carbon nanotube structures.

BACKGROUND

Carbon nanotube film can be fabricated by drawing from a carbon nanotube array grown on a growing substrate (e.g., silicon wafer), as disclosed by U.S. Pat. No. 8,048,256 to Feng et al. The carbon nanotube film is free standing and comprises a plurality of carbon nanotubes joined end-to-end by van der Waals attractive force therebetween. The carbon nanotubes in the carbon nanotube film are substantially aligned along the lengthwise direction of the carbon nanotube film, and thus, the carbon nanotube film has good thermal and electrical conductivity along the direction of the aligned carbon nanotubes. The carbon nanotube film is substantially transparent and can be used as a conductive thin film. Therefore, the carbon nanotube film can be used in many different fields, such as touch panels, liquid crystal displays, speakers, heating devices, thin film transistors, cables, and the like.

BRIEF DESCRIPTION OF THE DRAWINGS

Implementations of the present technology will now be described, by way of example only, with reference to the attached figures, wherein.

DETAILED DESCRIPTION

Figure 1:
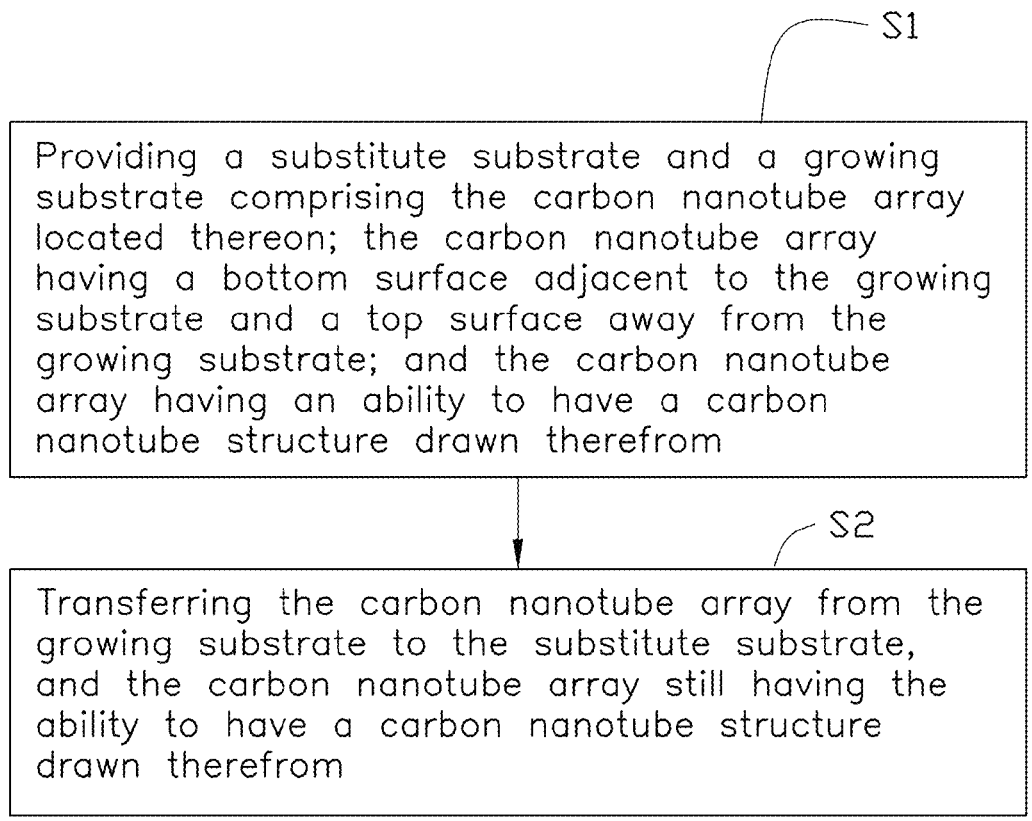
FIG. 1 is a flow chart of an embodiment of a method for transferring a carbon nanotube array.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "contact" is defined as a direct and physical contact. The term "substantially" is defined to be essentially conforming to the particular dimension, shape, or other description that is described, such that the component need not be exactly conforming to the description. The term "comprising," when utilized, means "including, but not necessarily limited to"; it specifically indicates open-ended inclusion or membership in the so-described combination, group, series, and the like.

Figure 2:
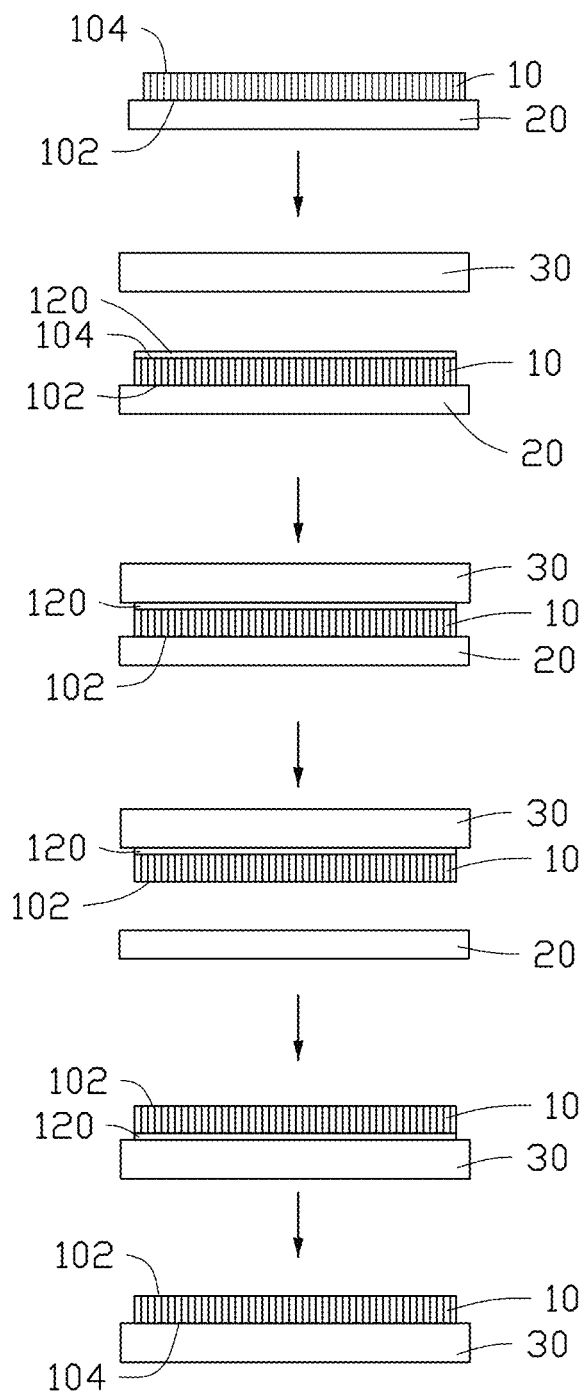
FIG. 2 is a schematic structural view of an embodiment of a method for transferring a carbon nanotube array.

Referring to FIG. 1 and FIG. 2, the present disclosure is described in relation to a method for transferring a carbon nanotube array 10.

In block S1, a substitute substrate 30 and a growing substrate 20 are provided. The growing substrate 20 has a carbon nanotube array 10 grown thereon, and the carbon nanotube array 10 is in a state that is capable of having the carbon nanotube structure 40 drawn therefrom. The carbon nanotube array 10 comprises a bottom surface 102 adjacent to the growing substrate 20 and a top surface 104 away from the growing substrate 20.

In block S2, the carbon nanotube array 10 is transferred from the growing substrate 20 onto the substitute substrate 30. The state of the carbon nanotube array 10 before, during, and after the transfer onto the substitute substrate 30 is still capable of having the carbon nanotube structure 40 drawn therefrom.

The carbon nanotube structure 40 can be a free-standing structure including a plurality of carbon nanotubes joined end-to-end by van der Waals attractive force therebetween. The carbon nanotube structure 40 can be a carbon nanotube film or a carbon nanotube wire.

The carbon nanotube array 10 is grown on the growing substrate 20 by a chemical vapor deposition (CVD) method. The carbon nanotube array 10 comprises a plurality of carbon nanotubes oriented substantially perpendicular to a growing surface of the growing substrate 20. The carbon nanotubes in the carbon nanotube array 10 are closely bonded together side-by-side by van der Waals attractive forces. By controlling growing conditions, the carbon nanotube array 10 can be essentially free of impurities such as carbonaceous or residual catalyst particles. Accordingly, the carbon nanotubes in the carbon nanotube array 10 are closely contacting each other, and a relatively large van der Waals attractive force exists between adjacent carbon nanotubes. The van der Waals attractive force is so large that when drawing a carbon nanotube segment (e.g., a few carbon nanotubes arranged side-by-side), adjacent carbon nanotube segments can be drawn out end-to-end from the carbon nanotube array 10 due to the van der Waals attractive forces between the carbon nanotubes. The carbon nanotubes are continuously drawn to form a free-standing and macroscopic carbon nanotube structure 40, which can be in the shape of a film or a wire. The carbon nanotube array 10 that can have the carbon nanotube structure 40 drawn therefrom can be a super aligned carbon nanotube array. A material of the growing substrate 20 can be P-type silicon, N-type silicon, or other materials that are suitable for growing the super aligned carbon nanotube array.

The carbon nanotube structure 40 drawn from the carbon nanotube array 10 comprises a plurality of carbon nanotubes joined end-to-end and can be a free-standing carbon nanotube film. The carbon nanotube film comprises a plurality of carbon nanotubes substantially aligned along the same direction.

Figure 3:
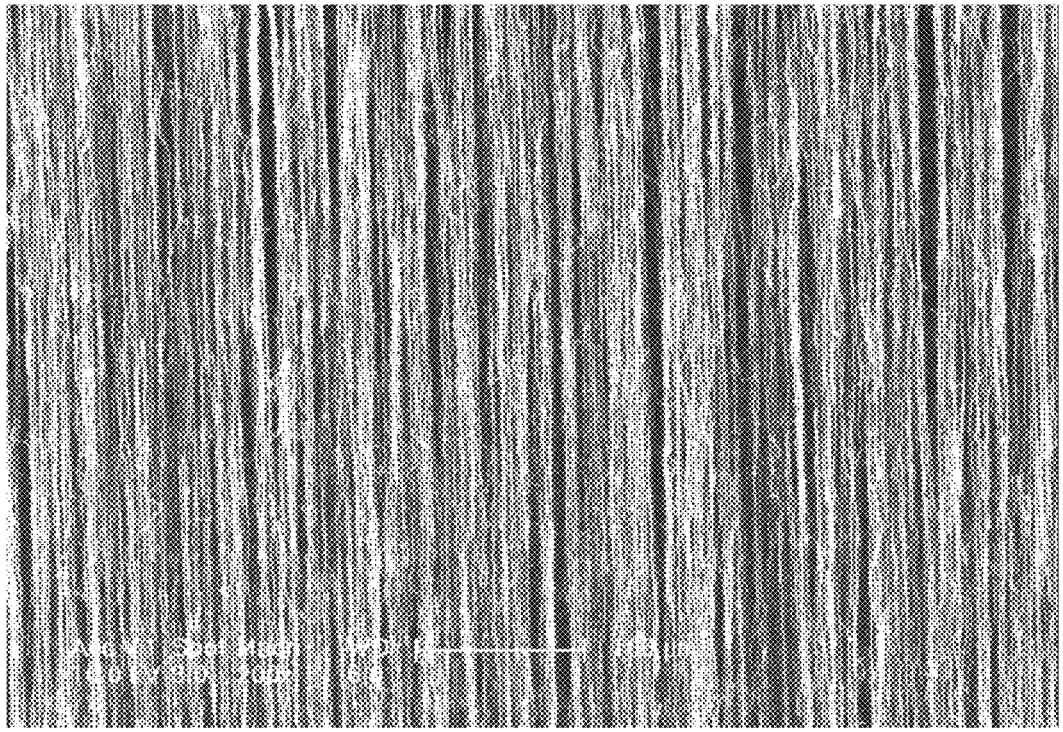
FIG. 3 shows a scanning electron microscope (SEM) image of a carbon nanotube film drawn from the carbon nanotube array.
Figure 4:
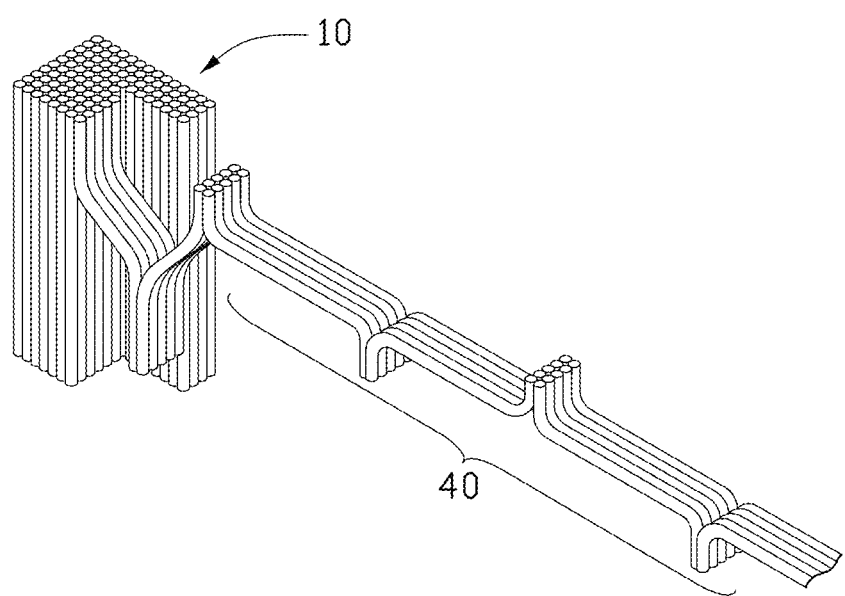
FIG. 4 shows carbon nanotubes joined end-to-end.

Referring to FIG. 3 and FIG. 4, the carbon nanotube film can comprise or consist of a plurality of carbon nanotubes. In the carbon nanotube film, the overall aligned direction of a majority of the carbon nanotubes is substantially aligned along the same direction parallel to a surface of the carbon nanotube film. A majority of the carbon nanotubes are substantially aligned along the same direction in the carbon nanotube film. Along the aligned direction of the majority of carbon nanotubes, each carbon nanotube is joined to adjacent carbon nanotubes end to end by van der Waals attractive force therebetween, whereby the carbon nanotube film is capable of being free-standing structure. There may be a minority of carbon nanotubes in the carbon nanotube film that are randomly aligned. However, the number of the randomly aligned carbon nanotubes is very small and does not affect the overall oriented alignment of the majority of carbon nanotubes in the carbon nanotube film. Some of the majority of the carbon nanotubes in the carbon nanotube film that are substantially aligned along the same direction may not be exactly straight, and can be curved at a certain degree, or not exactly aligned along the overall aligned direction by a certain degree. Therefore, partial contacts can exist between the juxtaposed carbon nanotubes in the majority of the carbon nanotubes aligned along the same direction in the carbon nanotube film. The carbon nanotube film can comprise a plurality of successive and oriented carbon nanotube segments. The plurality of carbon nanotube segments are joined end to end by van der Waals attractive force. Each carbon nanotube segment comprises a plurality of carbon nanotubes substantially parallel to each other, and the plurality of paralleled carbon nanotubes are in contact with each other and combined by van der Waals attractive force therebetween. The carbon nanotube segment has a desired length, thickness, uniformity, and shape. There can be clearances between adjacent and juxtaposed carbon nanotubes in the carbon nanotube film. A thickness of the carbon nanotube film at the thickest location is about 0.5 nanometers to about 100 microns (e.g., in a range from 0.5 nanometers to about 10 microns). When the carbon nanotube structure 40 has a small width, the carbon nanotube structure 40 can be a free-standing carbon nanotube wire.

The term "free-standing" comprises, but is not limited to, a structure that does not need to be supported by a substrate. For example, a free-standing carbon nanotube structure 40 can sustain the weight of itself when it is hoisted by a portion thereof without any significant damage to its structural integrity. If the free-standing carbon nanotube structure 40 is placed between two separate supporters, a portion of the free-standing carbon nanotube structure 40 suspended between the two supporters can maintain structural integrity. The free-standing carbon nanotube structure 40 can be realized by the successive carbon nanotubes joined end to end by van der Waals attractive force.

In the present disclosure, the growing of the carbon nanotube array 10 and the drawing of the carbon nanotube structure 40 are processed on different structures (i.e., the growing substrate 20 and the substitute substrate 30). The substitute substrate 30 for drawing the carbon nanotube structure 40 can be made of low-price materials, and the growing substrate 20 can be recycled quickly. Thus, production of the carbon nanotube structure 40 can be optimized.

The substitute substrate 30 can be a soft, elastic, or rigid solid substrate. The substitute substrate 30 has a surface to accept the carbon nanotube array 10 thereon. During transferring of the carbon nanotube array 10 from the growing substrate 20 to the substitute substrate 30, the state of the carbon nanotube array 10 is still capable of drawing the carbon nanotube structure 40 from the carbon nanotube array 10 on the substitute substrate 30. That is, the carbon nanotube array 10 transferred to the substitute substrate 30 is still a super aligned carbon nanotube array.

The carbon nanotube array 10 is arranged upside down on the surface of the substitute substrate 30. The carbon nanotubes are grown from the growing surface of the growing substrate 20 to form the carbon nanotube array 10. The carbon nanotube comprises a bottom end adjacent or contacting the growing substrate 20 and a top end away from the growing substrate 20. The bottom ends of the carbon nanotubes form the bottom surface 102 of the carbon nanotube array 10, and the top ends of the carbon nanotubes form the top surface 104 of the carbon nanotube array 10. After the carbon nanotube array 10 is transferred to the substitute substrate 30, the top surface 104 of the carbon nanotube array 10 is now adjacent to or contacting the substitute substrate 30, and the bottom surface 102 of the carbon nanotube array 10 is now away from the substitute substrate 30.

In block S2, the carbon nanotube array 10 can be transferred from the growing substrate 20 to the substitute substrate 30 at room temperature (e.g., 10° C. to 40° C.). Block S2 can comprise blocks S21 and S22.

In block S21, the substitute substrate 30 is placed on the top surface 104 of the carbon nanotube array 10, and adhesive layer 120 is sandwiched between a surface of the substitute substrate 30 and the top surface 104 of the carbon nanotube array 10.

In block S22, the substitute substrate 30 and the growing substrate 20 are moved away from each other, thereby separating the carbon nanotube array 10 from the growing substrate 20.

The surface of the substitute substrate 30 and the top surface 104 of the carbon nanotube array 10 can be bonded, a bonding force ($F_{BC}$) between the carbon nanotube array 10 and the substitute substrate 30 should be larger than a bonding force ($F_{AC}$) between the carbon nanotube array 10 and the growing substrate 20. Thus, during the moving step in block S22, the carbon nanotube array 10 can be separated from the growing substrate 20, and meanwhile the carbon nanotube array 10 is still bonded with the substitute substrate 30, thus transferred to the substitute substrate 30. That is, $F_{AC} < F_{BC}$.

However, if simply bare top ends 114 make contact with the surface of the substitute substrate 30, the bonding force (e.g., van der Waals forces) formed therebetween due to the contacting is small. Therefore, the adhesive layer 120 is introduced to increase the bonding force ($F_{BC}$) between the carbon nanotube array 10 and the substitute substrate 30.

The adhesive layer 120 can be previously formed on the top surface 104 of the carbon nanotube array 10 before placing the substitute substrate 30 on the top surface 104 of the carbon nanotube array 10. The material of the adhesive layer 120 can be selected from the materials that have relatively large bonding force to the substitute substrate 30. The adhesive layer 120 can firmly combined the top surface 104 of the carbon nanotube array 10 with the surface of the substitute substrate 30.

On the other hand, to ensure that the carbon nanotube array 10 transferred to the substitute substrate 30 is still capable of having the carbon nanotube structure 40 drawn therefrom, $F_{BC}$ should be smaller than the van der Waals attractive forces ($F_{CC}$) between the carbon nanotubes in the carbon nanotube array 10. That is, $F_{BC} < F_{CC}$. Therefore, after the step S2, the adhesive layer 120 can be removed to decrease the $F_{BC}$. The removal of the adhesive layer 120 should not vary or destroy the shape of the carbon nanotube array 10. The adhesive layer 120 should be capable of being removed completely. Therefore, the thickness of the adhesive layer 120 should be very small, such as about 1 nanometer~50 microns. In one embodiment, the thickness of the adhesive layer 120 is in a range from about 1 micron to 10 microns. The material of the adhesive layer 120 can be a polymer with a small molecule weight, such as polyvinylidene fluoride (PVDF), polyvinylidene chloride, and polytetrafluoroethylene (PTFE). The adhesive layer 120 can be at a solid state, liquid state, or liquid-solid state (e.g, a paste or a slurry).

In one embodiment, block S21 comprises blocks S211 and S212.

In block S211, the adhesive layer 120 is formed on the top surface 104 of the carbon nanotube array 10. The adhesive agent such as the small molecule weight polymer can dissolved or dispersed in a solvent to form a solution. The solution can be formed into (e.g., sprayed into) fine droplets or a mist in the air and drop or collect onto the top surface 104 of the carbon nanotube array 10 to form the adhesive layer 120. The adhesive layer 120 can spread on the entire top surface 104.

In block S212, the substitute substrate 30 and the carbon nanotube array 10 on the growing substrate 20 are brought together such that the surface of the substitute substrate 30 and the adhesive layer 120 on the top surface 104 are contacting each other. The substitute substrate 30 and the top surface 104 of the carbon nanotube array 10 are both in contact and combined with the adhesive layer 120.

In another embodiment, block S21 comprises blocks S211' and S212'.

In block S211', the adhesive layer 120 is formed on the surface of the substitute substrate 30 as the way it is formed on the top surface 104 of the carbon nanotube array 10 in the above embodiment.

In block S212', the substitute substrate 30 and the carbon nanotube array 10 on the growing substrate 20 are brought together such that the top surface 104 of the carbon nanotube array 10 and the adhesive layer 120 on the surface of the substitute substrate 30 are contacting each other. The substitute substrate 30 and the top surface 104 of the carbon nanotube array 10 are both in contact and combined with the adhesive layer 120.

The surface of the substitute substrate 30 can be substantially flat. The material of the substitute substrate 30 is not limited and can be at least one of metal, glass, crystal, ceramic, silicon, silicon dioxide, plastic, and resin, such as polymethyl methacrylate (PMMA), polyethylene terephthalate (PET), and poly(dimethylsiloxane) (PDMS3).

In block S22, due to the bonding between the carbon nanotube array 10 and the substitute substrate 30 by the adhesive layer 120, the separating of the two substrates can separate the carbon nanotube array 10 from the growing substrate 20. During the separating, a majority of the carbon nanotubes in the carbon nanotube array 10 can be detached from the growing substrate 20 at the same time by moving either the substitute substrate 30 or the growing substrate 20, or both, away from each other along a direction substantially perpendicular to the growing surface of the growing substrate 20. The carbon nanotubes of the carbon nanotube array 10 are detached from the growing substrate 20 along the growing direction of the carbon nanotubes. When both the substitute substrate 30 and the growing substrate 20 separate, the two substrates both moves along the direction perpendicular to the growing surface of the growing substrate 20 and depart from each other.

During the entire transferring of the carbon nanotube array 10 from the growing substrate 20 to the substitute substrate 30 in block S21 to S22, the substitute substrate 30 is always in solid state.

The adhesive layer 120 can be made up by conventional adhesive. However, the van der Waals attractive force ($F_{CC}$) between the carbon nanotubes in the carbon nanotube array 10 is very small. Thus, almost all the conventional adhesive, especially organic polymer, causes $F_{BC} > F_{CC}$, which is unsatisfactory for drawing the carbon nanotube structure 40 from the transferred carbon nanotube array 10 on the substitute substrate 30. Thus, an additional block S3 can be further comprised.

In block S3, the adhesive layer 120 between the substitute substrate 30 and the carbon nanotube array 10 is removed to decrease $F_{BC}$ to satisfy $F_{BC} < F_{CC}$. The adhesive layer 120 can be removed by heating. The adhesive layer 120 can be vaporized and the carbon nanotube array 10 can have a direct contact with the surface of the substitute substrate 30 and combined only by van der Waals attractive force. Thus, $F_{BC}$ can be decreased.

The state of the carbon nanotube array 10, before, during, and after the transfer onto the substitute substrate 30, and after the removal of the adhesive layer 120, is still capable of having the carbon nanotube structure 40 drawn therefrom.

Figure 5:
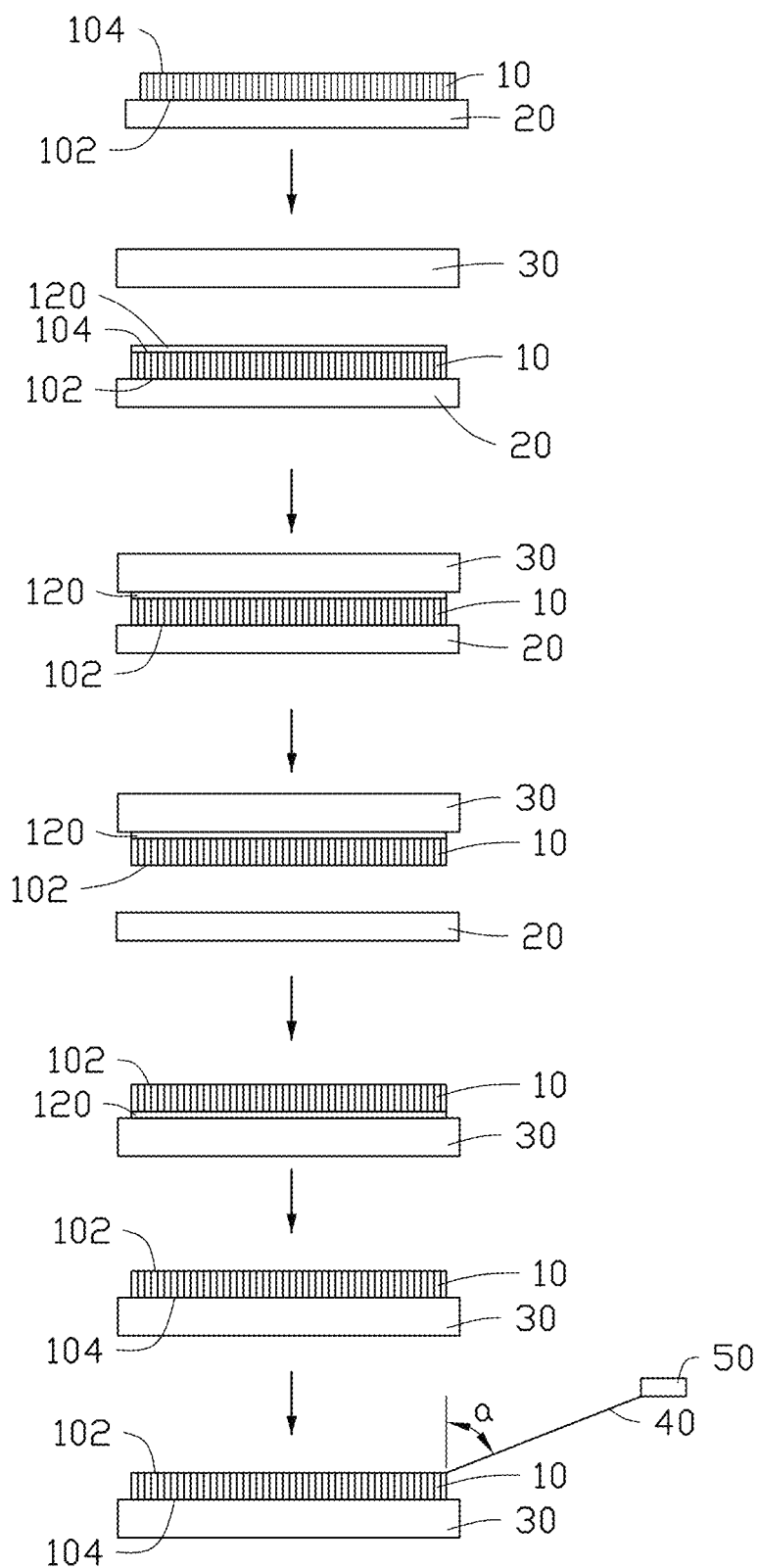
FIG. 5 is a schematic structural view of an embodiment of a method for forming a carbon nanotube structure.

Referring to FIG. 5, the present disclosure is described in relation to a method for forming a carbon nanotube structure 40 including the previously described blocks S1 to S3, and further including block S4. In block S4, the carbon nanotube structure 40 is drawn from the carbon nanotube array 10 on the substitute substrate 30.

Figure 6:
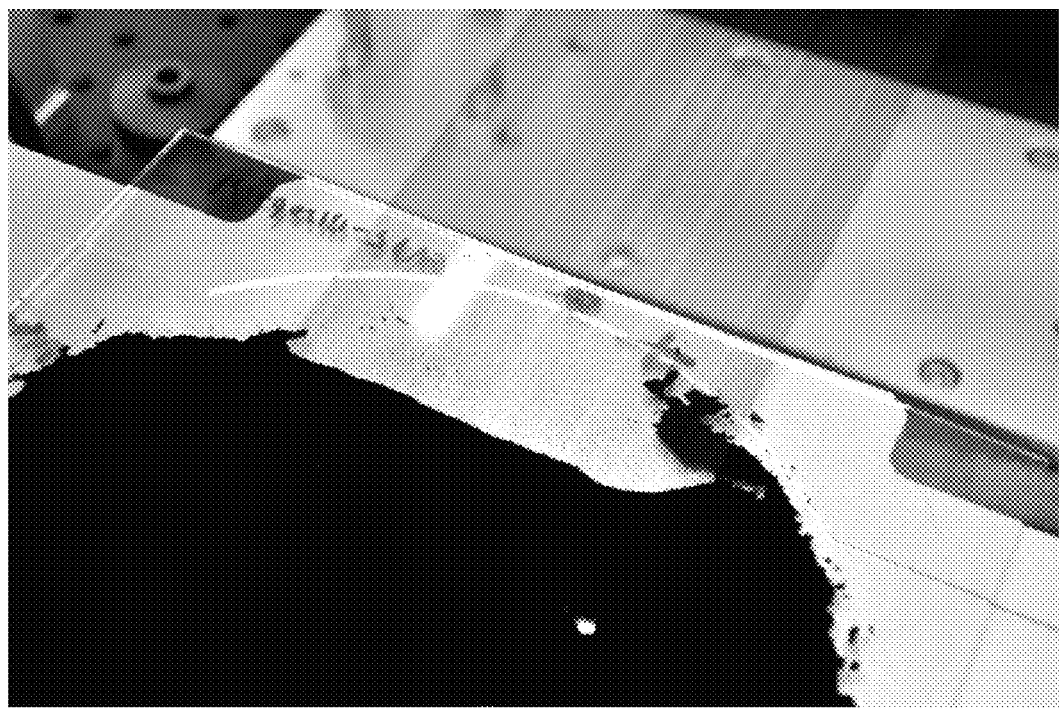
FIG. 6 shows an optical photo of drawing the carbon nanotube film from the carbon nanotube array transferred to a substitute substrate.

Referring to FIG. 6, in the block S4, the carbon nanotube structure 40 is drawn from the carbon nanotube array 10 that was transferred to the substitute substrate 30, not from the carbon nanotube array 10 located on the growing substrate 20. In one embodiment of block S4, the carbon nanotube structure 40 can be drawn from the carbon nanotube array 10 upside down on the surface of the substitute substrate 30 (i.e., drawn from the bottom surface 102 of the carbon nanotube array 10).

Block S4 can comprise block S41 and S42:

In block S41, a carbon nanotube segment having a predetermined width is drawn from the carbon nanotube array 10 on the substitute substrate 30. The segment is selected using a drawing tool 50 (e.g., adhesive tape, pliers, tweezers, or other tool allowing multiple carbon nanotubes to be gripped and pulled simultaneously).

In block S42, a plurality of carbon nanotube segments joined end to end by van der Waals attractive force is drawn by moving the drawing tool 50, thereby forming a continuous carbon nanotube structure 40.

In block S41, the carbon nanotube segment comprises a single carbon nanotube or a plurality of carbon nanotubes substantially parallel to each other. The drawing tool 50 such as adhesive tape can be used for selecting and drawing the carbon nanotube segment. The adhesive tape may contact with the carbon nanotubes in the carbon nanotube array to select the carbon nanotube segment. The drawing tool 50 can select a large width of carbon nanotube segments to form the carbon nanotube film, or a small width of the carbon nanotube segments to form the carbon nanotube wire.

In block S42, an angle between a drawing direction of the carbon nanotube segments and the growing direction of the carbon nanotubes in the carbon nanotube array 10 can be larger than 0 degrees (e.g., 30° to 90°).

Block S22 is different from block S4. The purpose of block S22 is to separate the carbon nanotube array 10 as a whole from the growing substrate 20. The carbon nanotube array 10 separated from the growing substrate 20 still in the array shape. The purpose of block S4 is to draw out carbon nanotubes one by one or segment by segment to form a carbon nanotube film or wire from the carbon nanotube array 10 on the substitute substrate 30.

In one embodiment of a method for making the carbon nanotube structure 40, the growing of the carbon nanotube array 10 and the drawing of the carbon nanotube structure 40 can be processed on different substrates. The substitute substrate 30 can be made of cheap material, and the expensive growing substrate 20 can be recycled quickly and used again for growing new carbon nanotube arrays 10, thus speeding up the production of the carbon nanotube arrays.

Depending on the embodiment, certain of the blocks of the methods described may be removed, others may be added, and the sequence of blocks may be altered. It is also to be understood that the description and the claims drawn to a method may comprise some indication in reference to certain blocks. However, the indication used is only to be viewed for identification purposes and not as a suggestion as to an order for the blocks.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A method for transferring a carbon nanotube array comprising:
    providing a substitute substrate and a growing substrate comprising the carbon nanotube array located thereon, the carbon nanotube array having a bottom surface adjacent to the growing substrate and a top surface away from the growing substrate;
    transferring the carbon nanotube array from the growing substrate to the substitute substrate, comprising:
        placing the substitute substrate on the top surface of the carbon nanotube array and sandwiching an adhesive layer between the substitute substrate and the carbon nanotube array; and
        separating the substitute substrate from the growing substrate, thereby separating the bottom surface of the carbon nanotube array from the growing substrate; and
    removing the adhesive layer.

2. The method of claim 1, further comprising forming a carbon nanotube structure from the carbon nanotube array after removing the adhesive layer, wherein the carbon nanotube structure is a carbon nanotube film or a carbon nanotube wire.

3. The method of claim 1, wherein the sandwiching the adhesive layer between the substitute substrate and the carbon nanotube array comprises:
    forming the adhesive layer on the top surface of the carbon nanotube array; and
    contacting a surface of the substitute substrate and the adhesive layer on the top surface with each other to combine the substitute substrate with the carbon nanotube array by the adhesive layer.

4. The method of claim 3, wherein the forming the adhesive layer on the top surface of the carbon nanotube array comprising: dissolving or dispersing an adhesive agent in a solvent to form a solution; and spraying the solution on the top surface of the carbon nanotube array to form the adhesive layer.

5. The method of claim 1, wherein the sandwiching the adhesive layer between the substitute substrate and the carbon nanotube array comprises:
    forming the adhesive layer on a surface of the substitute substrate; and
    contacting the top surface of the carbon nanotube array and the adhesive layer on the surface of the substitute substrate with each other.

6. The method of claim 5, wherein the forming the adhesive layer on the surface of the substitute substrate comprising: dissolving or dispersing an adhesive agent in a solvent to form a solution; and spraying the solution on the surface of the substitute substrate to form the adhesive layer.

7. The method of claim 1, wherein a thickness of the adhesive layer is in a range from about 1 nanometer to about 50 microns.

8. The method of claim 1, wherein the carbon nanotube array comprises a plurality of carbon nanotubes, and during the separating the carbon nanotube array from the growing substrate, substantially all carbon nanotubes are simultaneously detached from the growing substrate.

9. The method of claim 1, wherein the removing the adhesive layer comprises heating the adhesive layer after the carbon nanotube array is transferred to the substitute substrate.

10. The method of claim 1, wherein the growing substrate comprises a growing surface for growing the carbon nanotube array, wherein separating the substitute substrate from the growing substrate comprises moving at least one of the substitute substrate and the growing substrate, and a moving direction of at least one of the substitute substrate and the growing substrate is substantially perpendicular to the growing surface during the separating of the at least one of the substitute substrate and the growing substrate.

11. A method for transferring a carbon nanotube array comprising:
    providing a first substrate and a second substrate comprising the carbon nanotube array located thereon; the carbon nanotube array having a bottom surface adjacent to the first substrate and a top surface away from the first substrate;

transferring the carbon nanotube array from the first substrate to the second substrate, comprising:
placing the second substrate on the top surface of the carbon nanotube array and sandwiching an adhesive layer between the second substrate and the carbon nanotube array; and
separating the second substrate from the first substrate, thereby separating the bottom surface of the carbon nanotube array from the first substrate; and
removing the adhesive layer by heating.

12. A method for forming a carbon nanotube structure comprising:
providing a substitute substrate and a growing substrate comprising the carbon nanotube array located thereon; the carbon nanotube array having a bottom surface adjacent to the growing substrate and a top surface away from the growing substrate;
transferring the carbon nanotube array from the growing substrate to the substitute substrate, comprising:
placing the substitute substrate on the top surface of the carbon nanotube array and sandwiching an adhesive layer between the substitute substrate and the carbon nanotube array; and
separating the substitute substrate from the growing substrate, thereby separating the bottom surface of the carbon nanotube array from the growing substrate;
removing the adhesive layer by heating; and
drawing the carbon nanotube structure from the carbon nanotube array on the substitute substrate.

13. The method of claim 1, wherein the carbon nanotube array comprises a plurality of carbon nanotubes substantially perpendicular to the top surface, and the plurality of carbon nanotubes is still substantially perpendicular to the top surface after transferring the carbon nanotube array from the growing substrate to the substitute substrate.

14. The method of claim 1, wherein the transferring the carbon nanotube array from the growing substrate to the substitute substrate comprises applying a pressing force to the carbon nanotube array by the substitute substrate, and a direction of the pressing force is substantially perpendicular to the growing surface.

15. The method of claim 14, wherein the pressing force is defined as f, and f satisfies $0 < f < 2 N/cm^2$.

* * * * *